United States Patent
Suciu et al.

(10) Patent No.: US 7,452,733 B2
(45) Date of Patent: Nov. 18, 2008

(54) METHOD OF INCREASING RELIABILITY OF PACKAGED SEMICONDUCTOR INTEGRATED CIRCUIT DICE

(75) Inventors: Paul I. Suciu, Saratoga, CA (US); Kristopher R. Marcus, Colorado Springs, CO (US); Charles B. Friedberg, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 330 days.

(21) Appl. No.: 11/451,693

(22) Filed: Jun. 13, 2006

(65) Prior Publication Data

US 2006/0226862 A1 Oct. 12, 2006

Related U.S. Application Data

(62) Division of application No. 10/940,128, filed on Sep. 14, 2004, now Pat. No. 7,105,364.

(51) Int. Cl.
*H01L 21/00* (2006.01)
*G01R 31/26* (2006.01)
*G01N 37/00* (2006.01)

(52) U.S. Cl. .............. 438/15; 324/765; 702/84

(58) Field of Classification Search ......... 702/58–59, 702/81–84, 75–76, 117–118, 185; 438/15; 324/765
See application file for complete search history.

(56) References Cited

U.S. PATENT DOCUMENTS

| | | | |
|---|---|---|---|
| 5,539,752 A | 7/1996 | Berezin et al. | 371/22.1 |
| 5,777,901 A | 7/1998 | Berezin et al. | 364/578 |
| 2002/0121915 A1 | 9/2002 | Montull et al. | 324/765 |
| 2003/0061212 A1 | 3/2003 | Smith et al. | 707/6 |

*Primary Examiner*—Ha Nguyen
*Assistant Examiner*—Valerie Brown
(74) *Attorney, Agent, or Firm*—Schwegman, Lundberg & Woessner P.A.

(57) ABSTRACT

Semiconductor dice are electrically tested prior to final assembly. Dice failing the test are identified and not packaged. However, "good dice" (i.e., those dice that passed testing) in proximity to the failed dice frequently fail prematurely in the field. Therefore, in one embodiment, a method to identify those dice having a probability for early failure includes identifying a core die and a die cluster, adding the core die and at least one additional die from the die cluster to a weighted character map, and assigning a weighting value to each of the dice added to the weighted character map. At least one tier of buffer dice is then added to the weighted character map adjacent to each die on the weighted character map. Both the dice from the die cluster and the tier of buffer dice are marked, thereby preventing those dice from being packaged and consequently, shipped to customers.

11 Claims, 17 Drawing Sheets

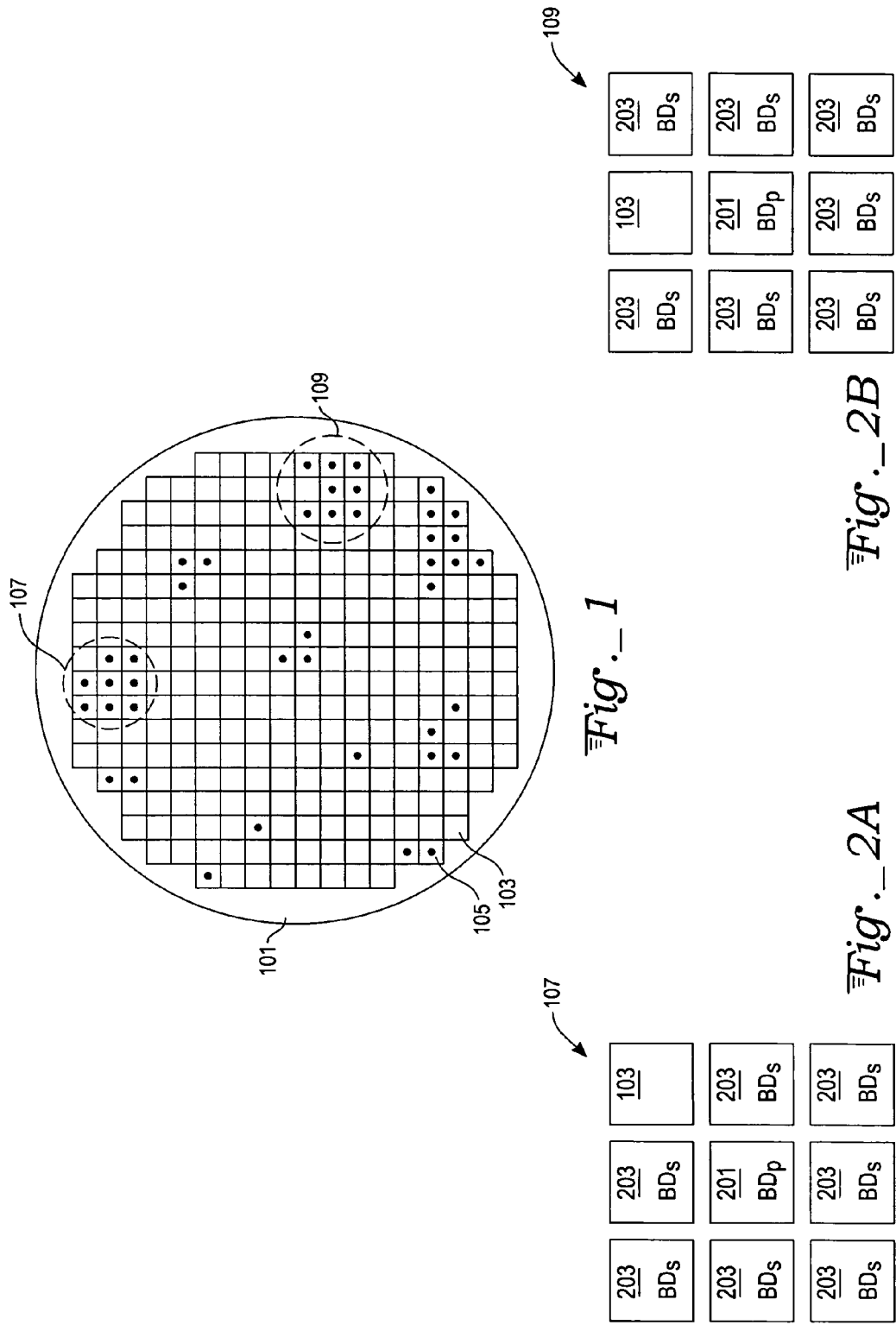

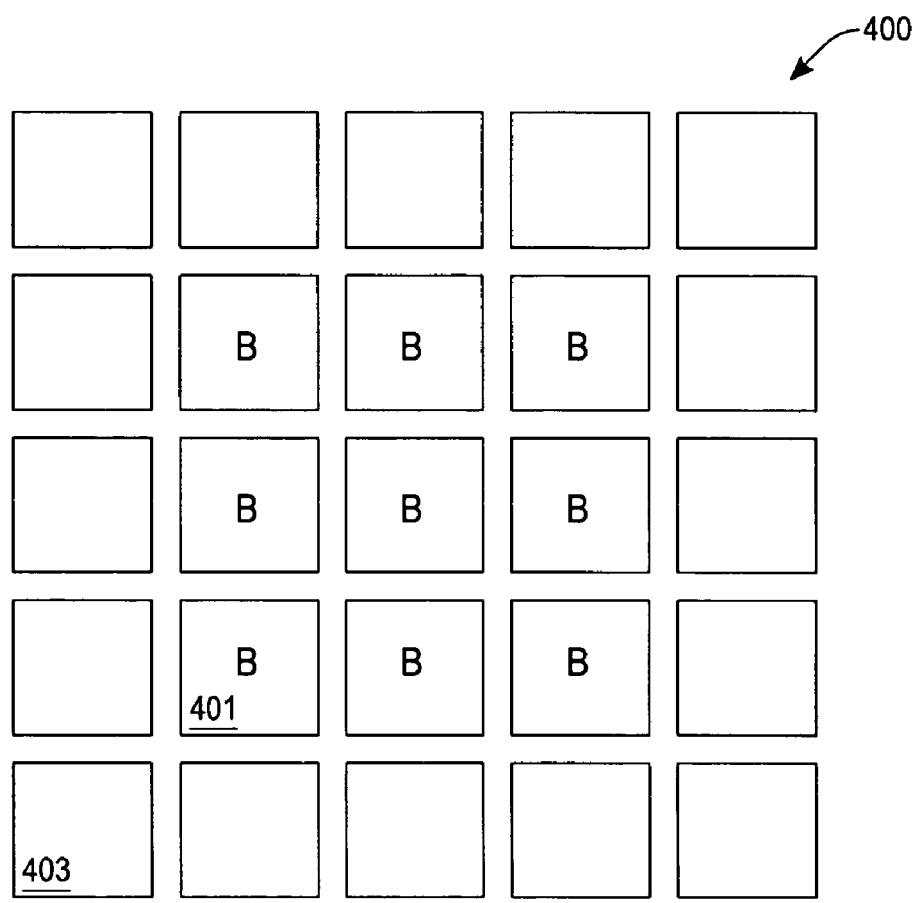
Fig._ 4A

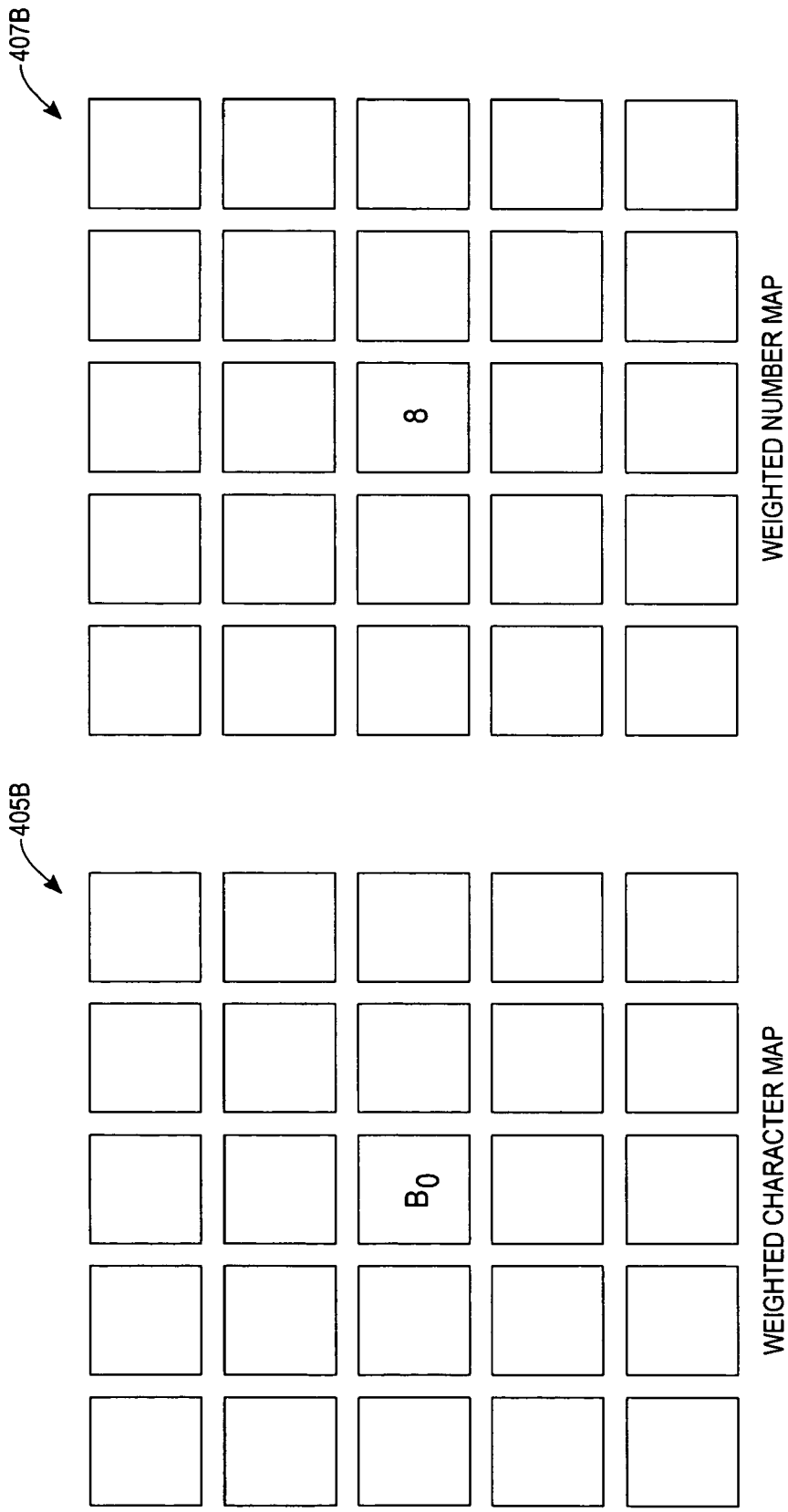
Fig. _ 4B

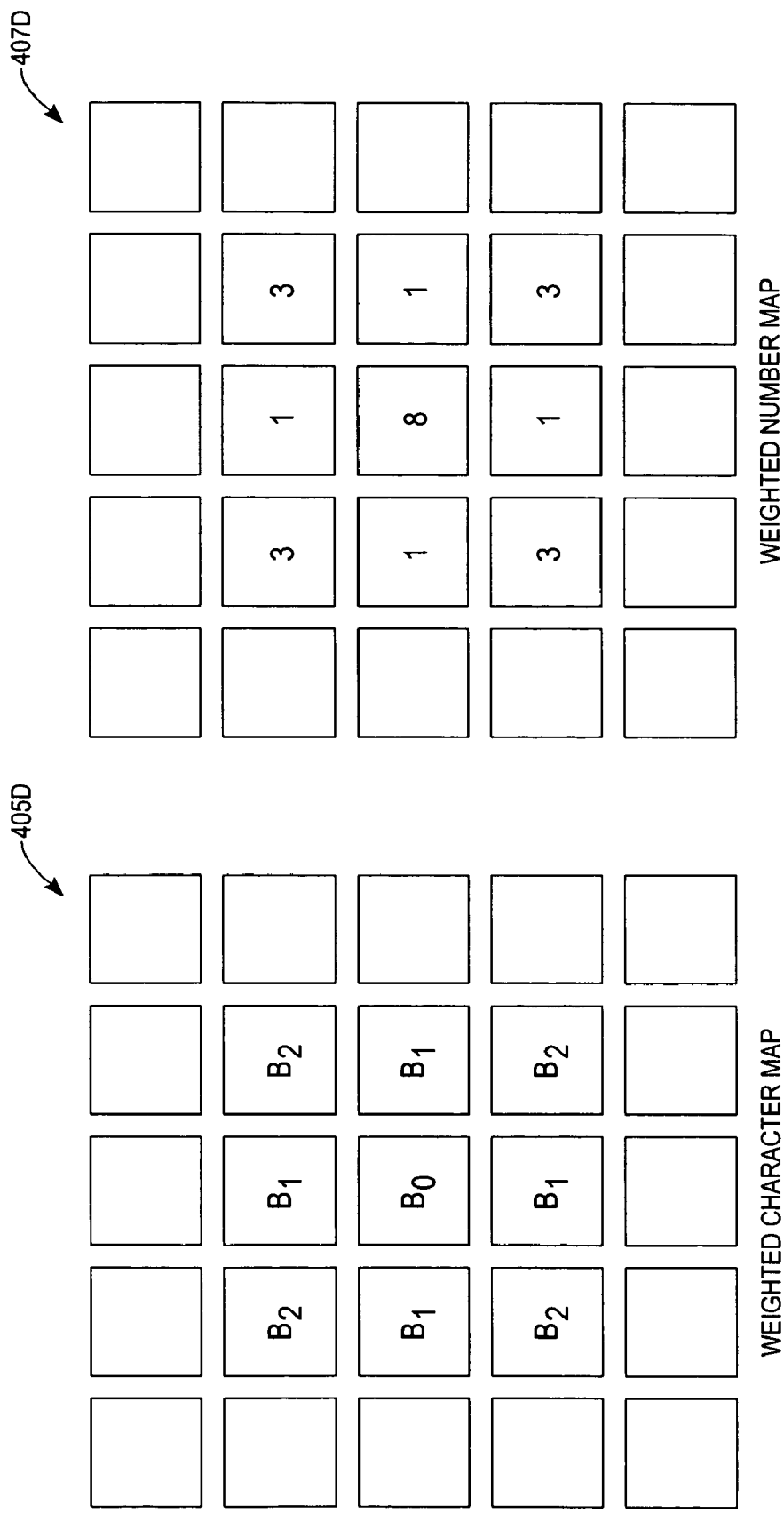
Fig._4D

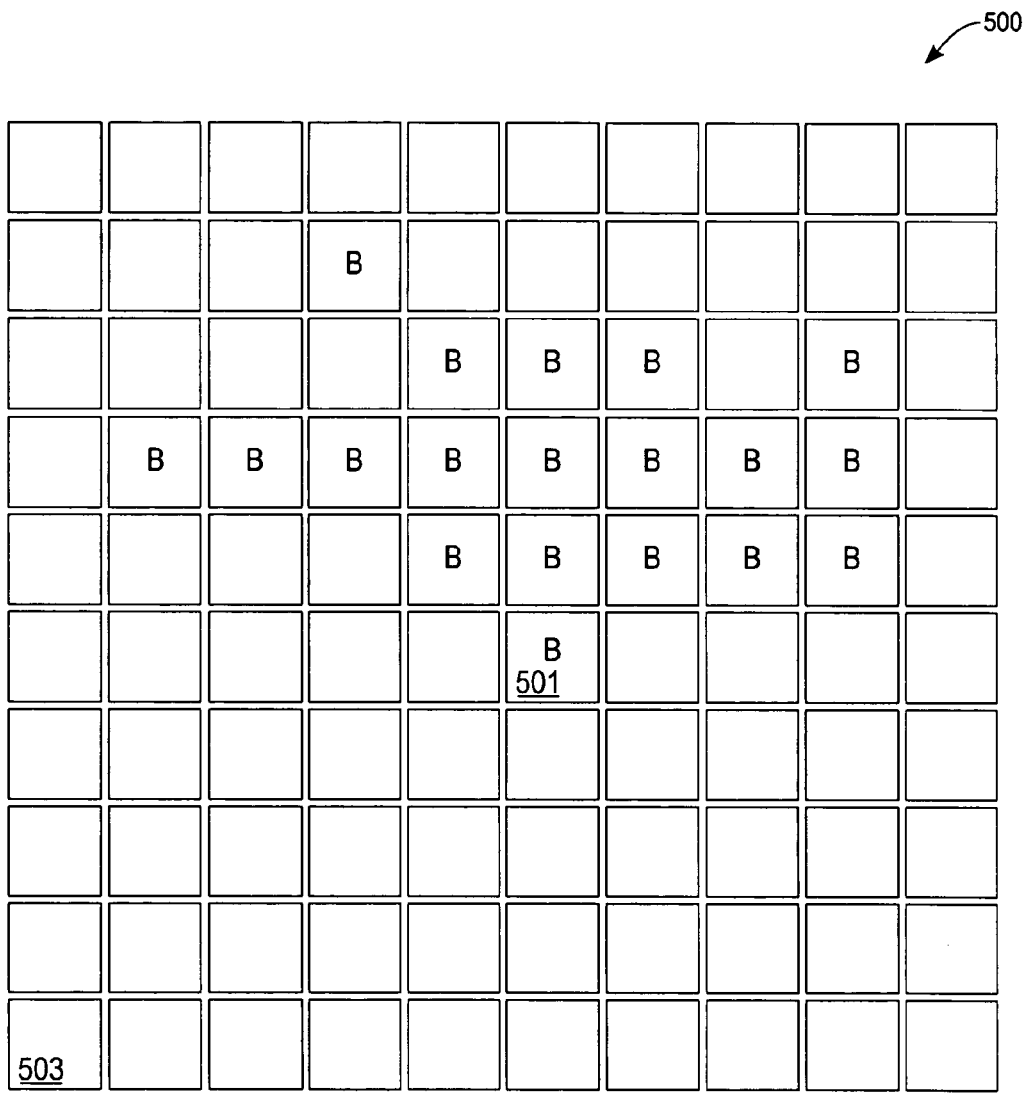
Fig._ 5A

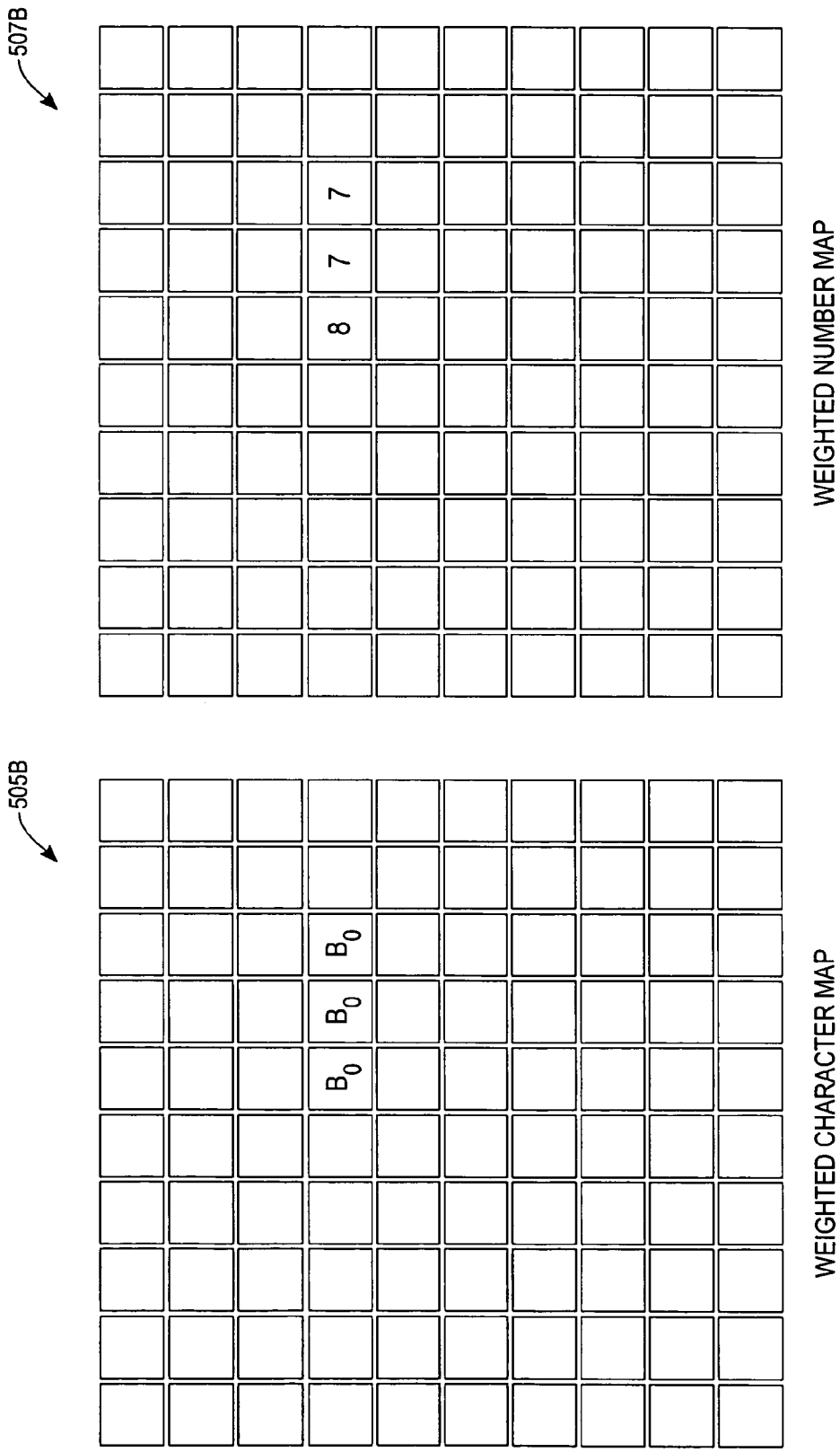
Fig._5B

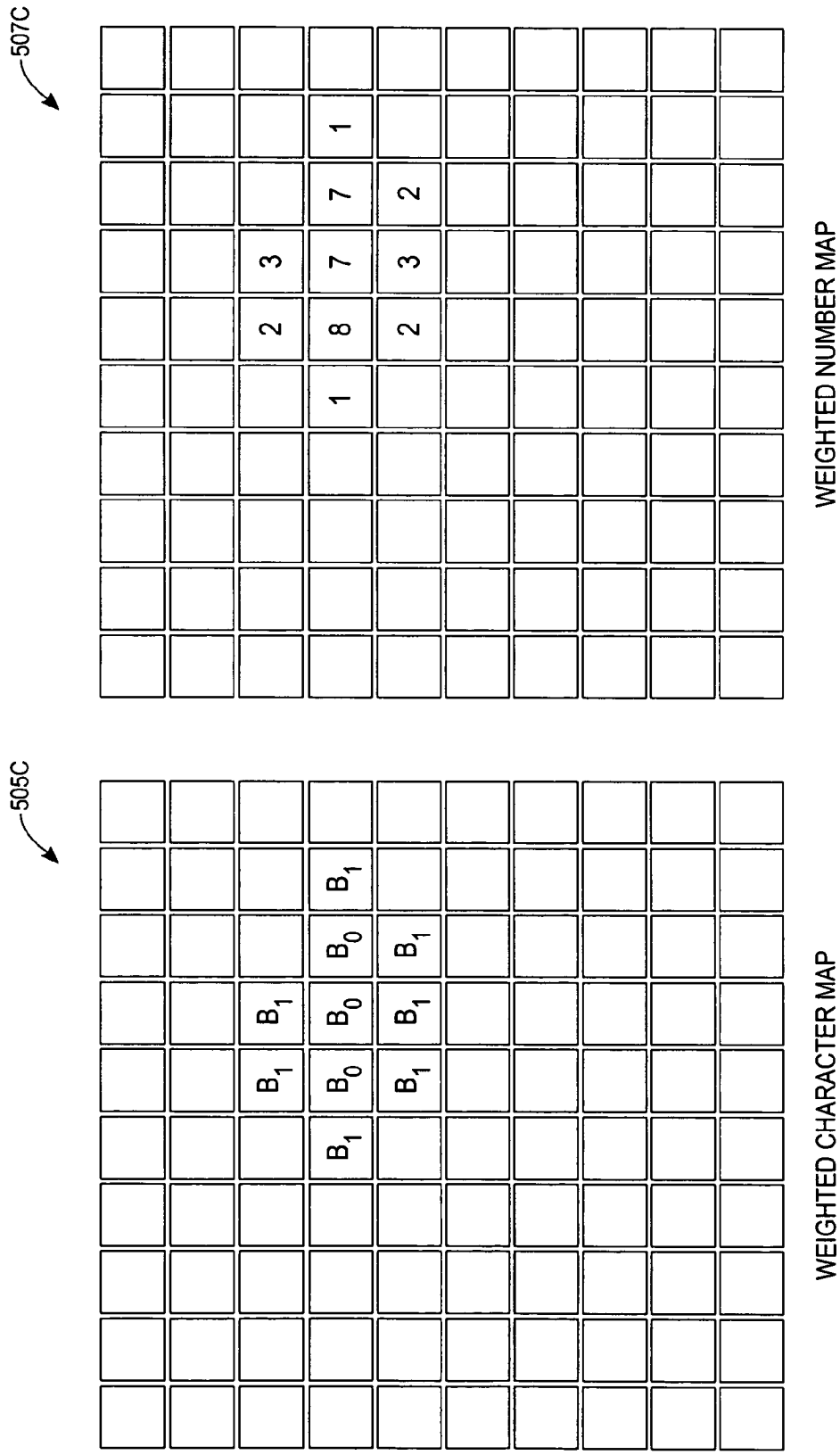
Fig._ 5C

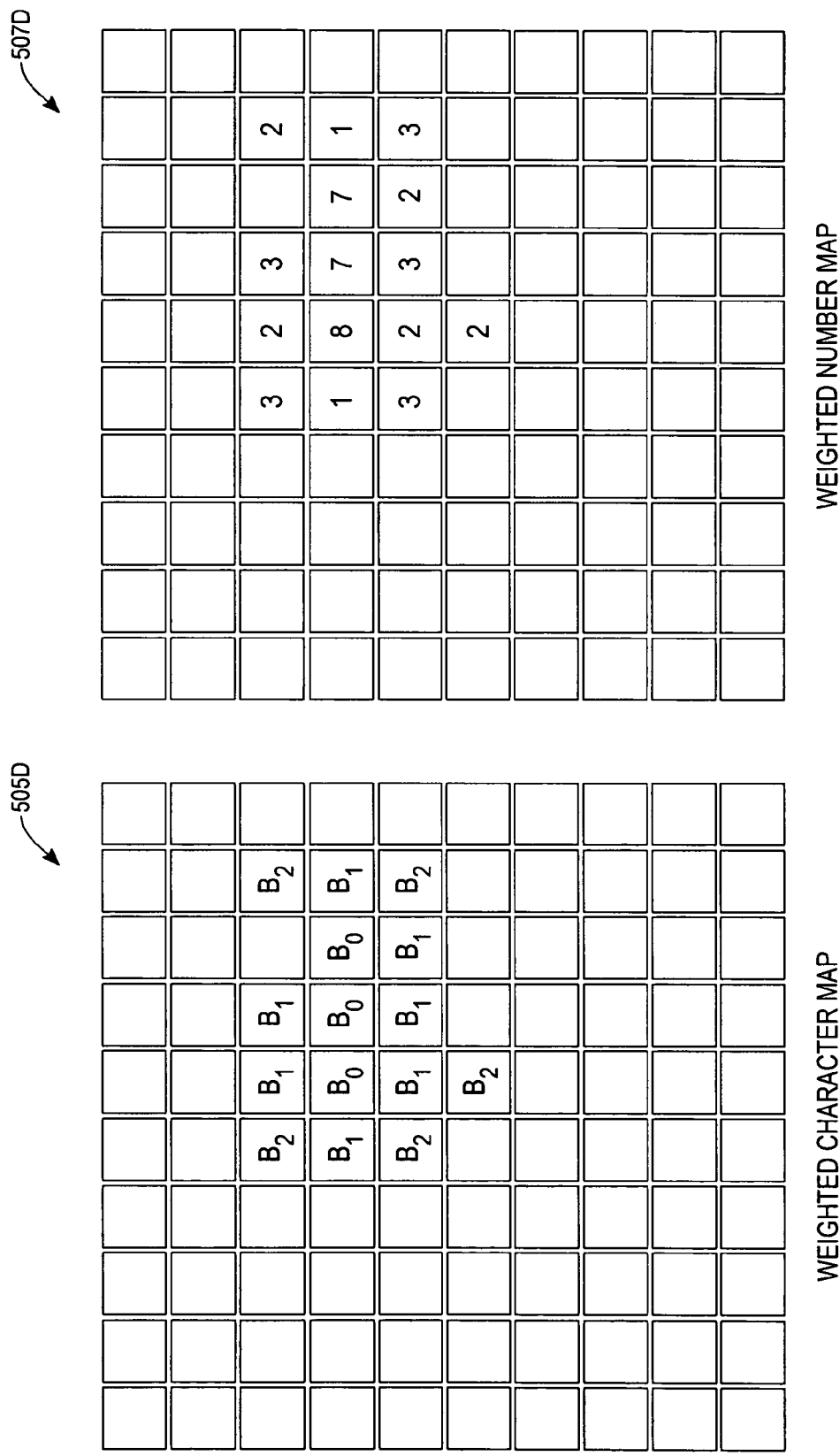
Fig._5D

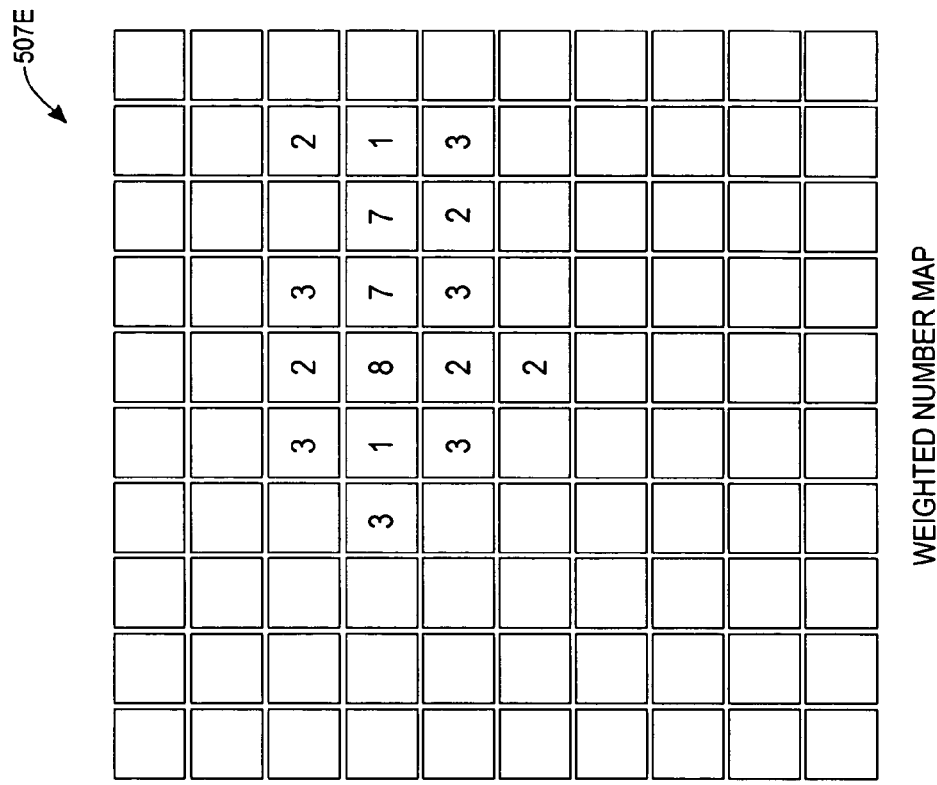
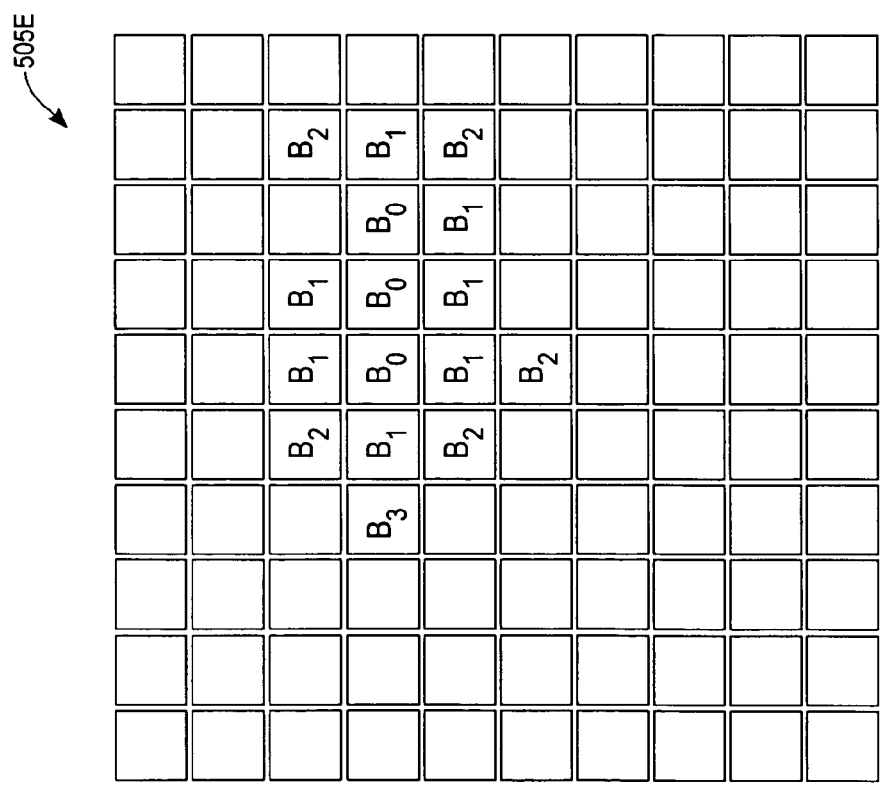
Fig. _ 5E

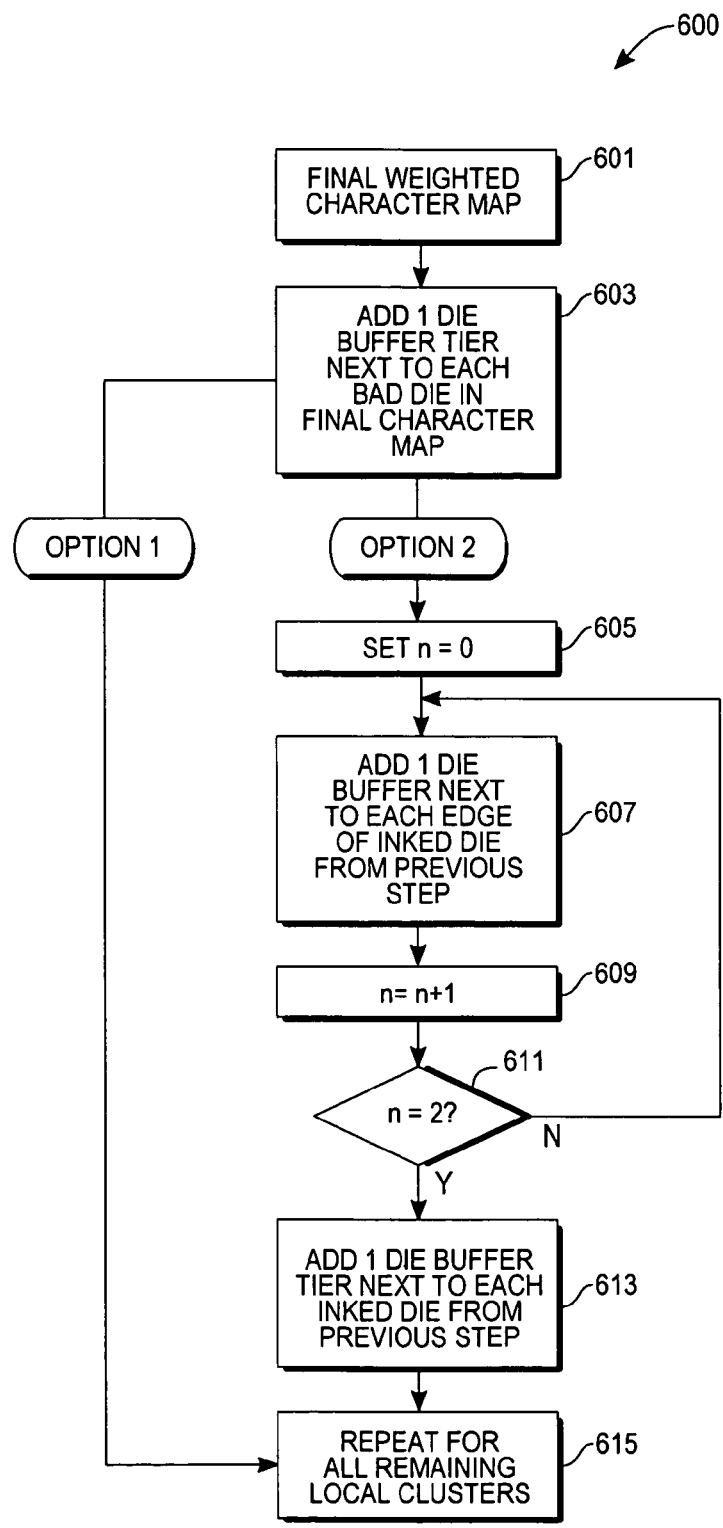
Fig. _ 6

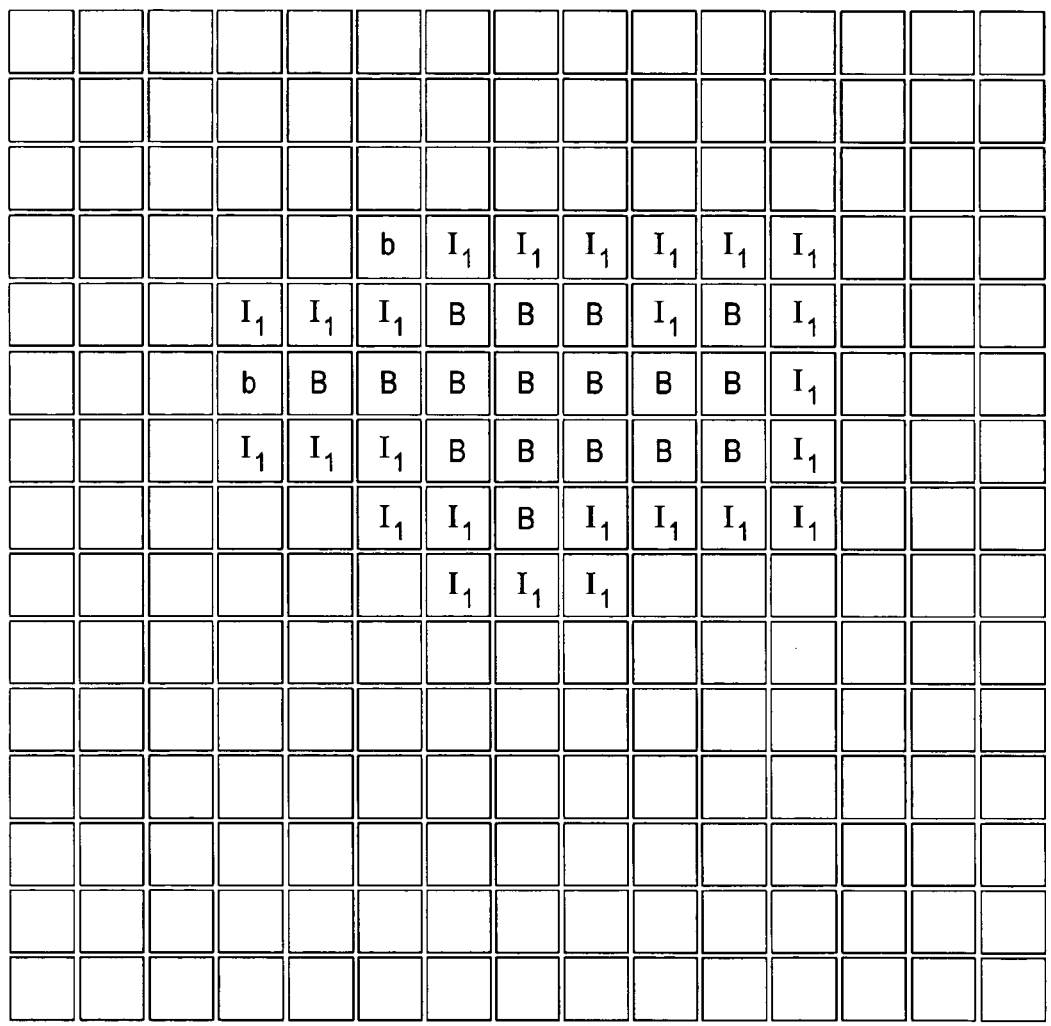
Fig._ 7A

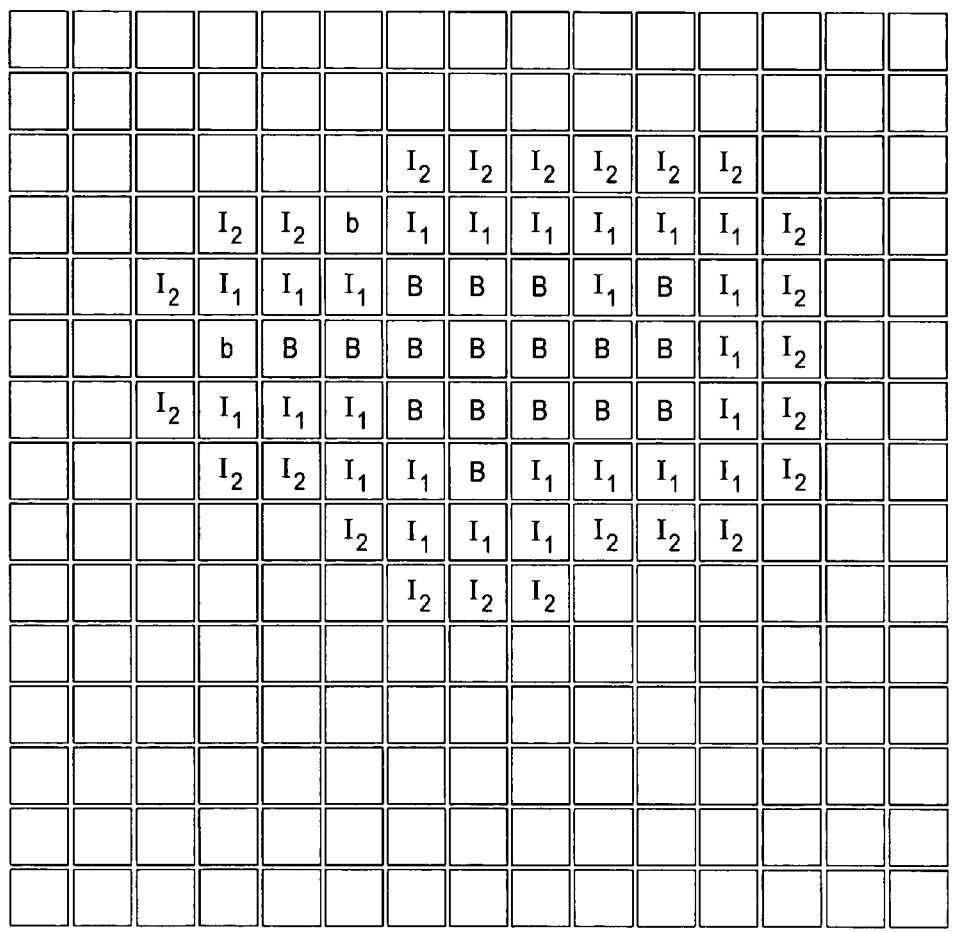
Fig._7B

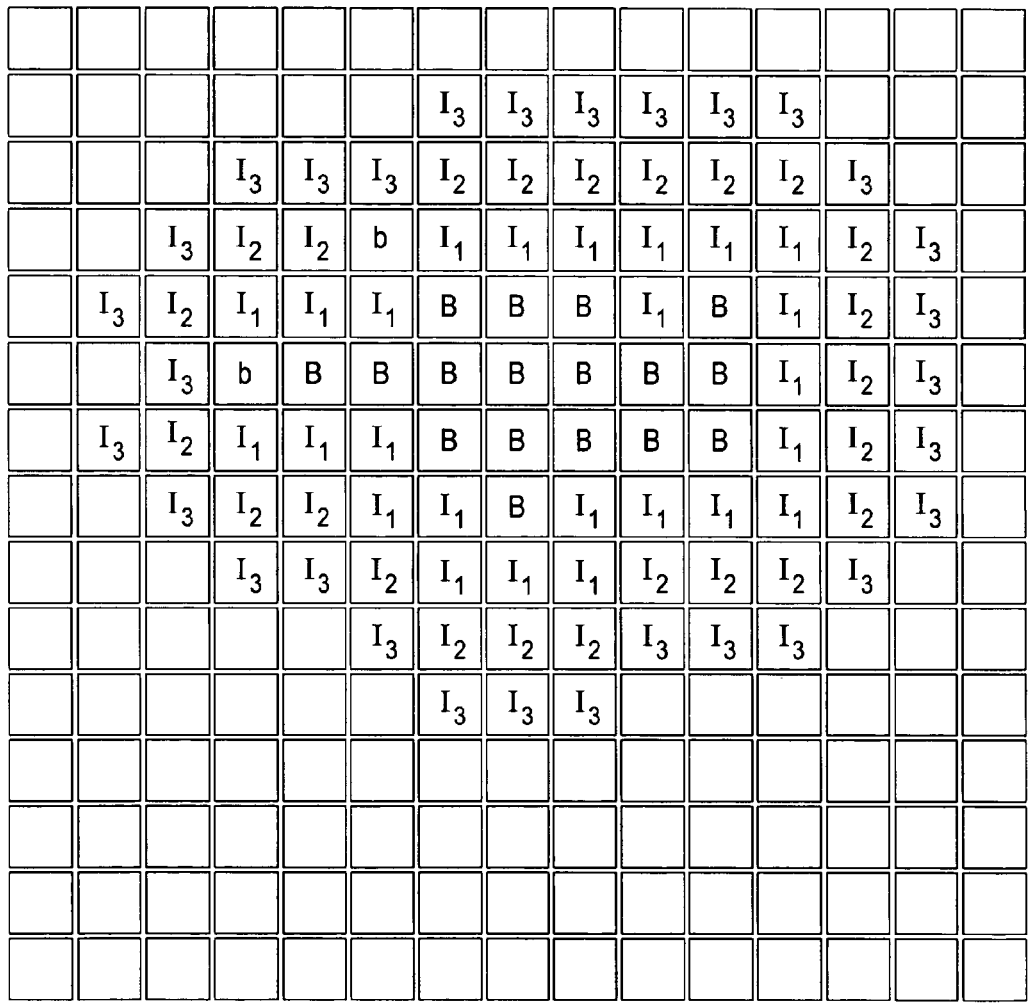
Fig._7C

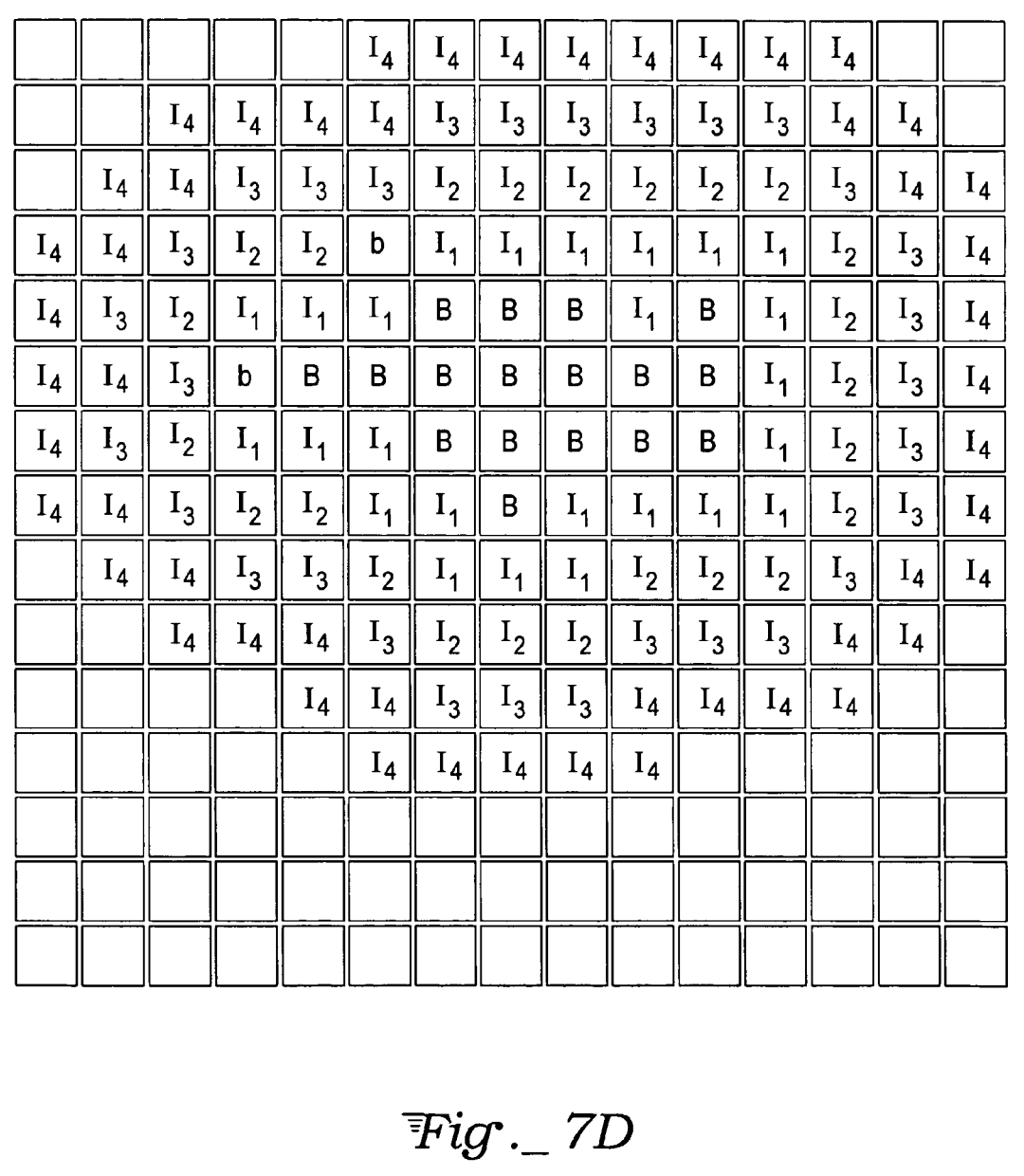

Fig._ 7D

METHOD OF INCREASING RELIABILITY OF PACKAGED SEMICONDUCTOR INTEGRATED CIRCUIT DICE

CROSS-REFERENCE TO RELATED APPLICATION

This is a divisional of U.S. patent application Ser. No. 10/940,128, filed Sep. 14, 2004, now U.S. Pat. No. 7,105,364.

TECHNICAL FIELD

The invention relates to a method of increasing reliability of semiconductor integrated circuit dice and specifically to a method for anticipating any semiconductor device which may have a high probability of failure.

BACKGROUND ART

In a typical semiconductor fabrication process, completed integrated circuit dice fabricated on wafers (for example, wafer 101 of FIG. 1) are subjected to an electrical testing (e.g., wafer probe or wafer sort) step prior to die singulation (i.e., dicing) and device packaging. The wafer probe will electrically test either a small sample of dice on a wafer or test each die separately by an electrical probe.

During the electrical probe, the wafer 101 is carefully mounted onto a movable plate (not shown) with at least three degrees of freedom (usually x-, y-, and z-axis movements). An electrical connection is made via a "probe card" (also not shown) which is a custom built circuit board designed to match a geometry of bonding pads on each die and connect the die to one or more pieces of test equipment. After making electrical contact between the probe card and the die, test programs are run to determine a pass/fail status of each tested die. If a die fails wafer probe, it is typically marked with an ink dot in the center of the die and the wafer 101 is moved into position for testing the next die. At assembly, an inked bad die 105 is discarded and a non-inked good die 103 is prepared for final packaging.

The non-inked die 103 which passed wafer probe could, however, due to its proximity to the inked bad die 105, fail prematurely in the field. Therefore, it is desirable to have a method to anticipate which dice may have a high probability for failure.

SUMMARY OF THE INVENTION

The present invention is a method to increase a reliability of packaged semiconductor integrated circuit dice. In one embodiment, prior to final packaging, the dice on a semiconductor wafer are electrically tested. Those dice failing the electrical test are identified and/or marked in some way and therefore, not packaged. However, "good dice" (i.e., those dice that passed electrical testing) which are in proximity to the failed dice may still fail prematurely in the field. Therefore, the method presented herein to identify those dice that, due to their proximity to the failed dice, have a probability for an earlier than expected failure includes first identifying a die cluster where the die cluster consists of dice that failed the electrical test, identifying a core die from the die cluster, adding the core die from the die cluster to a weighted character map, adding at least one additional die from the die cluster to a weighted character map in accordance with a procedure given herein, and assigning a weighting value to each of the dice added to the weighted character map. Once the weighted character map is completed, a tier of buffer dice is added to the weighted character map adjacent to each die on the weighted character map. Buffer dice are added in accordance with an exemplary algorithm presented herein. Both the dice from the die cluster and the tier of buffer dice are marked (e.g., inked) or otherwise indicated, thereby preventing those dice from being packaged and, subsequently, being shipped to customers.

Optionally, additional tiers of buffer dice may be added to the weighted character map. The additional tiers of buffer dice are added in accordance with a separate exemplary algorithm for each tier. The additional tiers serve to increase the reliability of remaining, unmarked dice.

In another embodiment, a method to increase the reliability of packaged semiconductor integrated circuit dice includes identifying one or more dice having failed an electrical test, adding the one or more failed dice to a weighted character map, adding a first tier of buffer dice to the weighted character map adjacent to each die on the weighted character map, and noting which dice from the die cluster and tier of buffer dice, thereby indicating dice not requiring packaging. As with the first described embodiment, additional tiers of buffer dice may be added to the weighted character map in accordance with a separate exemplary algorithm for each tier.

BRIEF DESCRIPTION OF THE DRAWINGS

FIG. 1 is a typical inked semiconductor wafer with inked dice after electrical test.

FIGS. 2A and 2B detail two types of clusters contained on semiconductor wafers in accordance with an embodiment of the present invention.

FIGS. 4A-4D is an example of an original defect wafer map produced by electrical testing and followed by corresponding weighted character and weighted number defect maps developed in accordance with the method of FIG. 3.

FIGS. 5A-5F is a further example of an original defect wafer map produced by electrical testing and followed by corresponding weighted character and weighted number defect maps developed in accordance with the method of FIG. 3.

FIG. 6 is a flowchart defining a method for constructing tiers of buffer dice onto the weighted character maps.

FIGS. 7A-7D are examples of weighted character maps incorporating tiers of buffer dice produced in accordance with the method of FIG. 6.

DETAILED DESCRIPTION OF THE INVENTION

With reference to FIG. 1, the wafer 101, containing a plurality of semiconductor integrated circuit dice may also contain clusters of bad dice. A cluster is defined, for example, as any single bad die that is surrounded by at least seven other bad dice. A first cluster type 107 and a second cluster type 109 are the cluster types possible under this definition when a total of eight bad dice are involved. FIG. 2A contains a primary bad die $BD_p$ 201 surrounded by seven other bad dice $BD_s$ 203, forming the first cluster type 107. FIG. 2B contains an alternative arrangement of seven additional bad dice $BD_s$ 203, thereby forming the second cluster type 109. A bad die 201 surrounded by more than seven bad dice 203 could therefore take a plurality of forms. The primary bad die 201 becomes the core cluster die and consequently, a locus point for building a weighted character map and a weighted number map, described herein. Optionally or in addition, a variable width exclusion zone, described infra, may be added to the weighted character map. A final weighted character map (not shown) is saved (e.g., in a wafer lot database) to indicate an x-y location of each of the bad dice 105, 201, 203.

Figure 3:
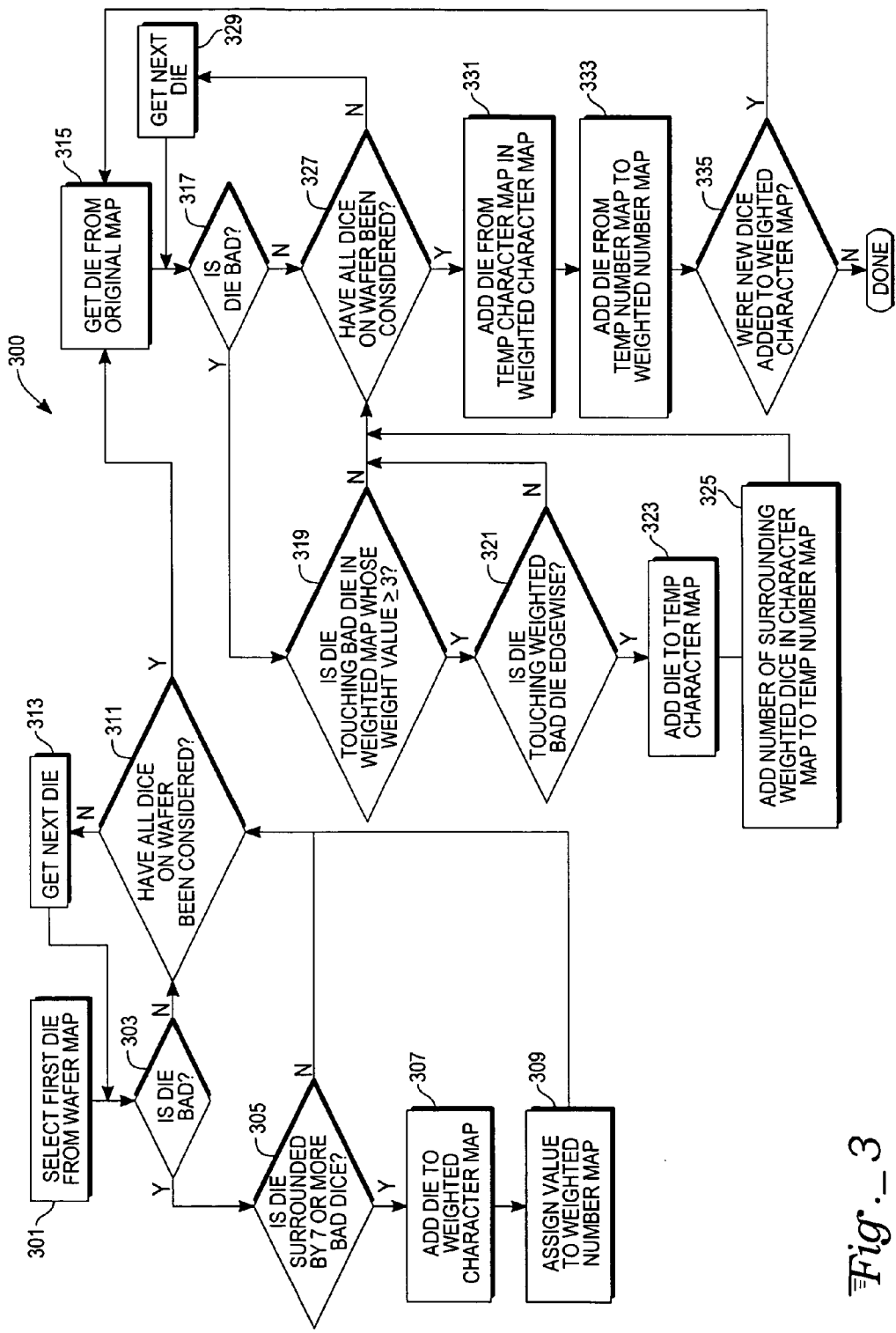
FIG. 3 is a flowchart defining a method for constructing weighted character and weighted number defect maps.

With reference to FIG. 3, an exemplary embodiment of a method 300 to anticipate which dice have a high probability for failure begins by selecting 301 a first die from an original wafer map. A determination 303 is made whether the first die is bad on the wafer. If the die is bad, a determination 305 next needs to be made whether the die is part of a die cluster. To determine 305 whether the die is part of a die cluster, by the exemplary definition given supra, at least seven additional bad dice must surround the die under consideration.

If the die is determined 303 not to be bad, the method will verify 311 whether all dice on the wafer have been considered. If all dice have not been considered, a next die is selected 313 and the process starts again with step 303.

If a determination 305 is made that the first die is part of a die cluster, the die is added 307 to a weighted character map and a value is assigned 309 to the die on a weighted number map. The method 300 then verifies 311 whether all remaining dice on the wafer have been considered.

Once verified 311 that all dice on the wafer have been considered, a die from the original wafer map is again selected 315. A determination 317 is made whether the die is bad on the wafer. If the die is bad, a determination 319 is made whether the die is touching another bad die with a weighting value of greater than or equal to 3 (i.e., $\geq 3$). If the die is touching another bad die with a weighting value of $\geq 3$, a further determination 321 is made whether the die is touching a weighted bad die edgewise. If so, the die is added 323 to a temporary character map and a quantitative value indicating the number of surrounding weighted dice in the weighted character map is added 325 to a temporary weighted number map. Referring back to FIGS. 2A and 2B, each primary bad die 201 is surrounded by seven bad dice 203. Hence, each primary bad die 201 would receive a quantitative value of "7."

The method 300 then continues by verifying 327 whether all dice on the wafer have been considered. Notice also, that if a determination is made that either the die is not touching another bad die with a weighted value $\geq 3$ in step 319 or that the die is not touching a weighted bad die edgewise in step 321, then the method 300 continues in each case to verify 327 whether all dice on the wafer have been considered. Further, if a determination 317 is made that the die is not bad, the method 300 also continues to step 327.

If a determination 327 is made that not all dice on the wafer have been considered, a next die on the wafer is selected 329 and the method restarts at step 317. However, if the determination 327 indicates that all dice have been considered, the die from the temporary character map is added 331 to a weighted character map and the die from the temporary number map is added 333 to a weighted number map. A determination 335 is then made whether new dice were added to the weighted character map. If so, another die is selected 315 from the original character map. If a result of the determination 335 indicates no new dice were added, the method 300 is complete.

A defect wafer map 400 of FIG. 4A generated by a wafer sort process, discussed supra, contains a cluster of bad dice B 401 surrounded by a field of good dice 403 (i.e., dice that passed wafer sort). In accordance with the exemplary method 300 described in conjunction with FIG. 3, a core cluster die $B_0$ is placed on a weighted character map 405B (FIG. 4B) and a weighted value is assigned to the core cluster die $B_0$ on a weighted number map 407B. In this example, the core cluster die is surrounded by eight bad dice (see defect wafer map 400) and thus receives a weighted value of "8."

Figure 4C:
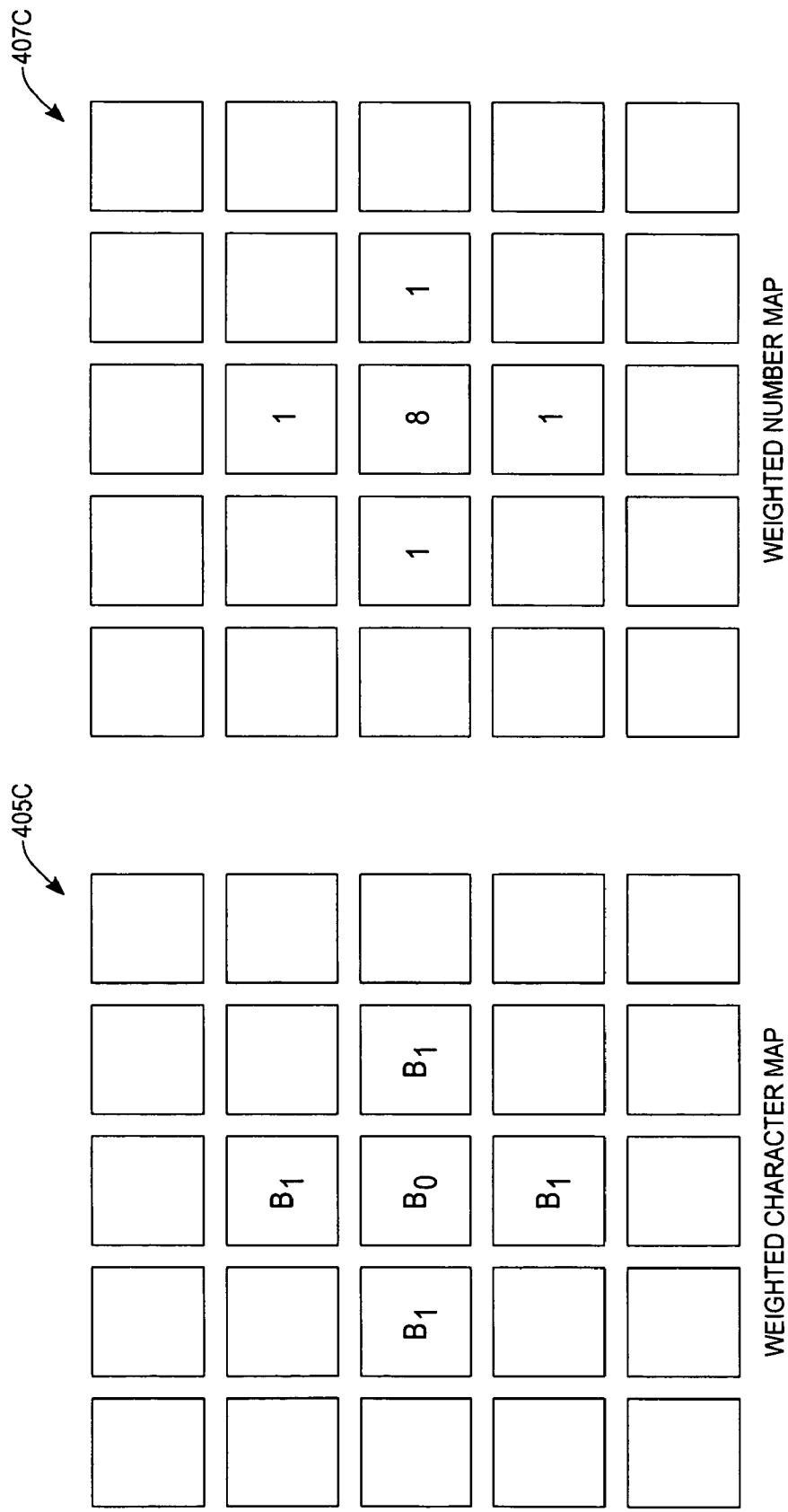

Next, adjacent bad dice $B_1$ that are touching the core cluster die $B_0$ on at least one edge are added to the weighted character map 405C (FIG. 4C). Recall that bad dice 401 in the defect wafer map 400 must touch the core cluster die $B_0$ on at least one edge during the initial iteration to be added to the weighted character map 405C. Here, the four bad dice on the corners of the cluster on the defect wafer map 400 are not touching the core cluster die $B_0$ edgewise and are, therefore, not added to the weighted character map 405C. Since each of the newly added bad dice $B_1$ are in contact with only one other bad die (here, the core cluster die), each bad die $B_1$ is assigned a weighting value of "1" on the weighted number map 407C. Recall that bad dice must be touching at least one other bad die on at least one edge to be added to the weighted character map, but may only be touching another bad die diagonally to add to a weighting quantity.

A further iteration examines the remaining four "corner dice." Now the remaining bad dice 401 are touching the other bad dice, $B_1$, on at least one edge (the first criterion for inclusion on the weighted character map) and are in contact, at least diagonally, with at least one bad die having a weighting of greater than or equal to three (the second criterion for inclusion on the weighted character map). The four "corner dice" are now added to the weighted character map 405D (FIG. 4D) as bad dice $B_2$, and each is assigned a weighting value of "3."

A defect wafer map 500 of FIG. 5 provides another example of a more complex defect cluster generated by a wafer sort process, discussed supra, contains a cluster of bad dice B 501 surrounded by a field of good dice 503 (i.e., dice that passed wafer sort). In accordance with the exemplary method described in conjunction with FIG. 3, core cluster dice $B_0$ are placed on a weighted character map 505B (FIG. 5B) and a weighted value is assigned to each of the dice $B_0$ on a weighted number map 507B. In this example, boundaries of regions contributing to the core cluster dice overlap. Therefore, each die in the overlapping boundary areas may contribute to the weighted value of more than one of the core cluster dice. Here, the core cluster dice are surrounded by either seven or eight bad dice (see wafer map 500) and thus receive weighted values of "7" or "8."

Next, adjacent bad dice 501 that are touching the core cluster dice $B_0$ on at least one edge are added to the weighted character map 505C (FIG. 5C). As with the example of FIGS. 4A-4D, bad dice 501 in the defect wafer map 500 must each touch at least one of the core cluster dice on at least edge during the initial iteration to be added to the weighted character map 505C. Here, nine bad dice 501 of the cluster on the defect wafer map 500 are not touching any of the core cluster dice and are, therefore, not added to the weighted character map 505C. However, a determination will be made shortly on whether each of these dice will be included on a weighted character map. Each of the newly added bad dice $B_1$ are in contact with various numbers of other bad dice $B_0$ and are therefore each assigned an appropriate weighting value on the weighted number map 507C. Again, bear in mind that bad dice 501 must be touching at least one other weighted bad die on at least one edge to be added to a weighted character map, but may only be touching another bad die diagonally to add to a weighting quantity for a particular die.

A further iteration examines the next tier of bad dice 501 from the defect wafer map 500. This tier of bad dice are touching other bad dice, $B_1$, on at least one edge and are in contact, at least diagonally, with at least one bad die, either $B_1$ or $B_0$, having a weighting of greater than or equal to three. This tier of bad dice is added to the weighted character map 505D as bad dice $B_2$, and each is assigned an appropriate weighting value.

Figure 5F:
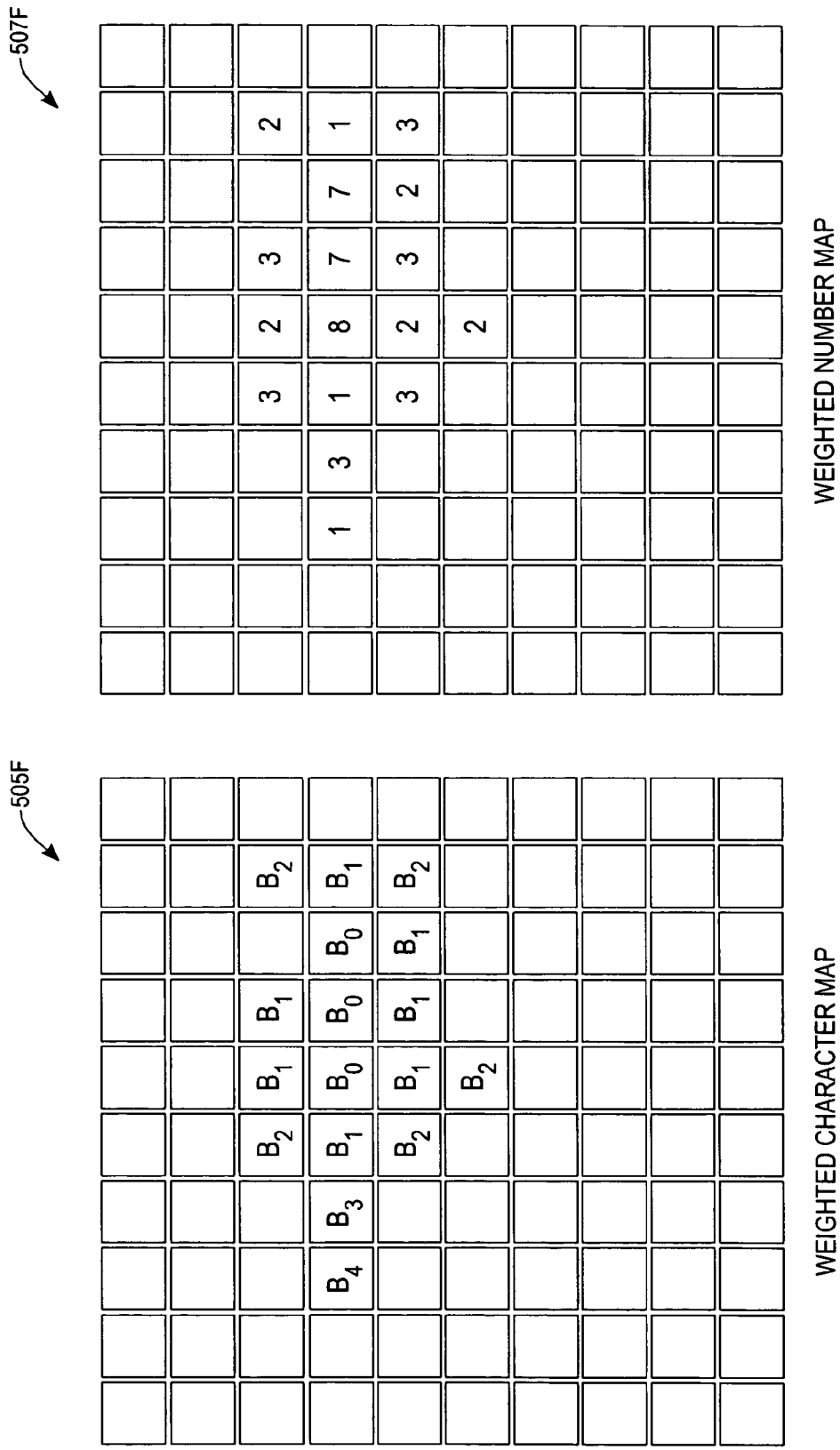

The iterative method 300 (FIG. 3) continues until all bad dice 501 from the wafer map 500 are examined, adding bad dice, $B_3$, to the weighted character map 505E with an appropriate weighting value on weighted number map 507E (FIG. 5E). In a final iteration, only a single bad die is added to the weighted character map 505F (FIG. 5F) as bad die $B_4$. Bad die $B_4$ is given a weighting value of "1" on the weighted character map 507F.

Notice that two of the bad dice 501 from the defect wafer map 500 are not transferred onto a weighted character map, and consequently, neither are they assigned a weighting value on a weighted number map. The first of these bad dice is located in the second row and fourth column. The second bad die is in the fourth row and second column. The first bad die does not have at least one edge touching a bad die on any character map (e.g., 505F). The second bad die does have one edge touching a bad die, $B_4$. However, the second criterion, being next to a bad die on a character map with a weighting value of greater than or equal to three, is not met—$B_4$ only has a weighting value of "1." Therefore in this example, there are two bad dice that do not transfer to the character map.

Once weighted character and number maps are produced, an exemplary die buffer construction method 600 (FIG. 6) serves to further reduce a probability of a semiconductor die failing in the field by preventing dice located proximately to known bad dice from being packaged as a final product.

The die buffer construction method 600 begins by utilizing 601 the final weighted character map (for example, weighted character map 505F, FIG. 5F) and adding 603 a single die buffer tier next to each bad die in the final weighted character map. A single die buffer is added next to an edge and diagonally next to each bad die in the final character map. The buffer dice are inked or otherwise indicated to prevent packaging the buffer dice after wafer dicing operations.

After the single die buffer tier is added 603, the method 600 may be complete for the local cluster (option 1) or additional buffer dice may be added (option 2). Under option 1, the method 600 for the local cluster is complete and the method is applied to any other clusters on the wafer. Under option 2, additional buffer tiers are added. A counter is initialized 605 to n=0 to determine how many additional buffer tiers are added. Next an additional die buffer tier is added 607 by placing a buffer die next to each edge of an inked die from a previous step. The counter is incremented 609 and a determination 611 is made whether n=2. (For this exemplary die buffer construction method 600, a total of up to four buffer tiers are added. Alternatively, for more buffer tiers, n will need to be incremented to higher value.) If n is less than 2, the method 600 loops back to add 607 another buffer tier. Once three buffer tiers are added, a final buffer tier is added 613 next to each edge of an inked die as well as diagonally next to an inked die. The process is then repeated 615 for any remaining local clusters on the wafer.

With reference to FIG. 7A, an example of using the exemplary die buffer construction method 600 begins by starting with the final weighted character map 505F (FIG. 5F) and adding and inking dice, $I_1$, for a first buffer tier. (Note that lower case "b's" indicate bad die from the original wafer map 500 that did not transfer to the final weighted character map 505F. These dice tested bad at e-test and will therefore not be used for product, however, they are not determinative in adding buffer tiers. Further note that first tier inked dice $I_1$ are located both on an edge and diagonally adjacent to bad dice B from the weighted character map 505F.)

In FIG. 7B, a second tier of buffer dice $I_2$ has been added inked. Note that a buffer tier is not added for diagonally adjacent dice. FIG. 7C has a third tier of buffer dice $I_3$ added according to the same rules as the second tier. Finally, a fourth tier of buffer dice $I_4$ has been added and inked as indicated in FIG. 7D. The fourth tier buffer dice $I_4$ are added according to the same rules as the first layer; that is, inked dice $I_4$ are located both on an edge and diagonally adjacent to bad dice $I_3$ from the weighted character map 505F.

In the foregoing specification, the present invention has been described with reference to specific embodiments thereof. For example, elements such as the weighted character map and weighted number map need not actually exist or be formed to practice the method described herein, but are described merely as a construct to better aid in conveying an intent of the present invention. Alternatively, the weighted character map and weighted number map may be developed as part of a database used to construct one or more die buffer tiers. Additionally, neither bad dice nor buffer dice require physical inking. Another method to indicate that such dice should not go to final packaging, such as noting such dice on a database, is sufficient. It will, therefore, be evident that various modifications and changes can be made thereto without departing from the broader spirit and scope of the present invention as set forth in the appended claims. The specification and drawings are, accordingly, to be regarded in an illustrative rather than a restrictive sense.

What is claimed is:

1. A method to increase a reliability of packaged semiconductor integrated circuit dice, the method comprising:
   identifying one or more dice having failed an electrical test;
   adding the one or more failed dice to a weighted character map;
   adding a first tier of buffer dice to the weighted character map adjacent to each die on the weighted character map; and
   indicating both the failed dice and the tier of buffer dice, thereby indicating dice not requiring packaging.

2. The method of claim 1 wherein the step of adding one or more dice having failed an electrical test are added to a weighted character map further comprises:
   identifying a core die, the core die being an electrically malfunctioning die surrounded by a plurality of other electrically malfunctioning dice; and
   locating an electrically malfunctioning die located adjacent to an edge of the core die.

3. The method of claim 1 wherein the first tier of buffer dice are located adjacent to an edge of the one or more failed dice.

4. The method of claim 1 wherein the first tier of buffer dice are located diagonally adjacent to the one or more failed dice.

5. The method of claim 3 further comprising adding a second tier of buffer dice to the weighted character map edgewise adjacent to each of the first tier of buffer dice on the weighted character map.

6. The method of claim 5 wherein the second tier of buffer dice are located adjacent to an edge of the first tier of buffer dice.

7. The method of claim 5 further comprising adding a third tier of buffer dice to the weighted character map adjacent to each of the second tier of buffer dice on the weighted character map.

8. The method of claim 7 wherein the third tier of buffer dice are located adjacent to an edge of the second tier of buffer dice.

9. The method of claim 7 further comprising adding a fourth tier of buffer dice to the weighted character map adjacent to each of the third tier of buffer dice on the weighted character map.

10. The method of claim 9 wherein the fourth tier of buffer dice are located adjacent to an edge of the third tier of buffer dice.

11. The method of claim 9 wherein the first tier of buffer dice are located diagonally adjacent to the third tier of buffer dice.

* * * * *